United States Patent
Nakata et al.

(10) Patent No.: US 9,121,101 B2
(45) Date of Patent: Sep. 1, 2015

(54) ETCHANT AND ETCHING METHOD USING THE SAME

(75) Inventors: Takuto Nakata, Tokyo (JP); Norikiyo Nakagawa, Tokyo (JP)

(73) Assignee: Asahi Kasei E-materials Corporation, Tokyo (JP)

( * ) Notice: Subject to any disclaimer, the term of this patent is extended or adjusted under 35 U.S.C. 154(b) by 0 days.

(21) Appl. No.: 14/128,494

(22) PCT Filed: Jun. 27, 2012

(86) PCT No.: PCT/JP2012/066428
§ 371 (c)(1),
(2), (4) Date: Feb. 25, 2014

(87) PCT Pub. No.: WO2013/002283
PCT Pub. Date: Jan. 3, 2013

(65) Prior Publication Data
US 2014/0202987 A1 Jul. 24, 2014

(30) Foreign Application Priority Data
Jun. 30, 2011 (JP) .................. 2011-145789

(51) Int. Cl.
*B44C 1/22* (2006.01)
*C23F 1/16* (2006.01)
(Continued)

(52) U.S. Cl.
CPC . *C23F 1/16* (2013.01); *C09K 13/00* (2013.01); *C09K 13/06* (2013.01); *G03F 7/0043* (2013.01); *G03F 7/32* (2013.01); *H01L 21/0337* (2013.01); *H01L 21/32134* (2013.01); *C23F 1/18* (2013.01)

(58) Field of Classification Search
CPC ............... C23F 1/18; C23F 1/16; C23F 1/14; C23F 1/44; B44C 1/22; B44C 1/228; H01L 21/311; H01L 21/31105; H01L 21/31111
USPC .......... 252/79.1, 79.2, 79.3, 79.4; 216/62, 65, 216/66, 67, 94, 103, 108
See application file for complete search history.

(56) References Cited

U.S. PATENT DOCUMENTS 7,175,962 B2   2/2007   Kouchiyama et al.
7,718,590 B2   5/2010   Suzuki et al.
(Continued)

FOREIGN PATENT DOCUMENTS

JP   2001-262374 A   9/2001
JP   2005-105333 A   4/2005
(Continued)

OTHER PUBLICATIONS
"Latest Resist Material" published by Johokiko Co., Ltd., pp. 59-79.
(Continued)

*Primary Examiner* — Lan Vinh
(74) *Attorney, Agent, or Firm* — Birch, Stewart, Kolasch & Birch, LLP

(57) ABSTRACT

To provide an etchant for copper oxide, control of the etching rate, and etching method using the same for enabling exposed portions to be selectively etched against unexposed portions in the case of performing exposure with laser light using an oxide of copper as a heat-reactive resist material, an etchant of the invention is an etchant for copper oxide to selectively remove a copper oxide of a particular valence from a copper oxide-containing layer containing copper oxides of different valences, and is characterized by containing at least an amino acid, a chelating agent and water, where a weight percentage of the amino acid is higher than that of the chelating agent, and pH thereof is 3.5 or more.

2 Claims, 6 Drawing Sheets

(51) Int. Cl.
- *C09K 13/06* (2006.01)
- *H01L 21/3213* (2006.01)
- *H01L 21/033* (2006.01)
- *C09K 13/00* (2006.01)
- *G03F 7/004* (2006.01)
- *G03F 7/32* (2006.01)
- *C23F 1/18* (2006.01)

(56) References Cited

U.S. PATENT DOCUMENTS

| | | | |
|---|---|---|---|
| 7,951,653 B1 * | 5/2011 | Park et al. | 438/132 |
| 8,226,837 B2 | 7/2012 | Kurihara et al. | |
| 8,809,696 B2 * | 8/2014 | Yamashita et al. | 174/268 |
| 2002/0033382 A1 * | 3/2002 | Kaufman et al. | 216/89 |
| 2002/0125461 A1 * | 9/2002 | Chou et al. | 252/79.1 |
| 2003/0119692 A1 * | 6/2003 | So et al. | 510/256 |
| 2007/0267764 A1 | 11/2007 | Morimoto | |
| 2009/0301996 A1 | 12/2009 | Visintin et al. | |
| 2010/0029088 A1 * | 2/2010 | Mayer et al. | 438/748 |
| 2010/0075114 A1 | 3/2010 | Kurihara et al. | |
| 2010/0081279 A1 * | 4/2010 | Palmer et al. | 438/667 |
| 2013/0026134 A1 | 1/2013 | Nakagawa et al. | |

FOREIGN PATENT DOCUMENTS

| | | |
|---|---|---|
| JP | 2005-105410 A | 4/2005 |
| JP | 2007-144995 A | 6/2007 |
| JP | 4055543 B2 | 3/2008 |
| JP | 2008-143162 A | 6/2008 |
| JP | 2008-168610 A | 7/2008 |
| JP | 2008-532289 A | 8/2008 |
| JP | 2011-16975 A | 1/2011 |
| KR | 10-2007-0115916 A | 12/2007 |
| TW | 200634177 A | 10/2006 |

OTHER PUBLICATIONS

International Search Report, issued in PCT/JP2012/066428, dated Sep. 4, 2012.

Masuhara et al., "Phase Transition Mastering", The 19th Symposium on Phase Change Optical Information Storage 2007 Proceedings, pp. 77-80.

* cited by examiner

ETCHANT AND ETCHING METHOD USING THE SAME

TECHNICAL FIELD

The present invention relates to an etchant for copper oxide and etching method used in an etching process in fine pattern processing techniques using copper oxide as a heat-reactive resist material.

BACKGROUND ART

In recent years, in the fields of semiconductor, optical • magnetic recording, etc., as demands for higher density, higher integration and others have increased, techniques have become essential for fine pattern processing of about several hundreds to tens of nanometers or less. Therefore, to achieve the fine pattern processing, elemental techniques of each process have been studied actively such as a mask • stepper, exposure and resist material.

Many studies on the resist material are performed, and currently, the most common resist material is a photoreactive organic resist (hereinafter, also referred to as a photoresist) that reacts by an exposure light source such as ultraviolet light, electron beam and X-rays (for example, see Patent Document 1 and Non-patent Document 1).

In the laser light used in exposure, the intensity of the laser light focused by the lens generally shows the Gaussian distribution form as shown in FIG. 1. In the Gaussian distribution, the spot diameter is defined by $1/e^2$. In general, the reaction of a photoresist starts by absorbing energy represented by $E=h\nu$ (E: energy, h: Planck constant, $\nu$: wavelength). Accordingly, the reaction is not dependent on the intensity of the light significantly, and is rather dependent on the wavelength of the light. Thus, the reaction occurs in the entire portion irradiated with the light (portion irradiated with light≈exposed portion). Therefore, when the photoresist is used, the photoresist is faithfully exposed with respect to the spot diameter.

The method of using a photoresist is an extremely useful method in forming fine patterns of about hundreds of nanometers. However, in order to form finer patterns, it is necessary to expose with a smaller spot than a pattern required in principle. Accordingly, it is indispensable to use a KrF laser, ArF laser or the like with short wavelengths as an exposure light source. However, these light source apparatuses are remarkably large-size and expensive, and are unsuitable from the viewpoint of reducing the manufacturing cost. Further, in the case of using the exposure light source of electron beam, X-rays or the like, since it is necessary to evacuate the exposure atmosphere to a vacuum state, using a vacuum chamber is required, and there are significant limitations from the viewpoints of the cost and increases in the size.

Meanwhile, when a substance is irradiated with the laser light having the distribution as shown in FIG. 1, the temperature of the substance also shows the same Gaussian distribution as the intensity distribution of the laser light. In this case, when a resist reacting at some temperature or more i.e. heat-reactive resist is used, as shown in FIG. 2, since the reaction proceeds only in the portion becoming a predetermined temperature or more, it is made possible to expose the range smaller than the spot diameter (portion irradiated with light≠exposed portion). In other words, without shortening the wavelength of the exposure light source, it is possible to form the pattern finer than the spot diameter, and by using the heat-reactive resist, it is possible to reduce the effect of the wavelength of the exposure light source.

Reported previously were techniques for using tungsten oxide (WOx), molybdenum oxide (MoOx), noble metal oxide or the like as a heat-reactive resist, and forming a fine pattern by exposure and thermal • photoreaction with a semiconductor laser or the like (for example, see Patent Documents 2 to 4 and Non-patent Document 2). The WOx and MoOx are resist materials called the imperfect oxide such that the oxidation degree X is set at a value lower than that of the perfect oxide, and are allowed to form a fine pattern by changing the oxidation degree X by heating due to exposure, making a difference in solubility with respect to an etchant due to the difference in the oxidation degree, and etching. Therefore, etching properties are changed due to a tiny difference in the oxidation degree X, and extremely significant techniques are required in order to manufacture a resist with high reproducibility from many parameters such as a state of a starting material, method of film deposition and method of exposure. Further, there has been another problem that tungsten (W) and molybdenum (Mo) are low in resistance to dry etching using fluorocarbons.

Meanwhile, the noble metal oxide is allowed to form a fine pattern by inducing decomposition of the noble metal oxide by thermal reaction, photoreaction or the like, making a difference in solubility with respect to an etchant in the undecomposed/decomposed portions and etching. For example, in the case of thermal reaction, this method causes decomposition when the material reaches some particular temperature (decomposition temperature), is therefore not affected significantly by a state (for example, a tiny difference in the oxidation degree or the like) of the starting material, and has characteristics easy to obtain a resist with extremely good reproducibility. However, the noble metal oxide that is a decomposition material used in Patent Documents 3 and 4 causes the decomposition reaction by thermal reaction, photoreaction or the like to enable a fine pattern to be formed, but is only permitted to adopt a sea-island structure in which resist portions left after etching are random because of accompanying particle growth of the material concurrently with decomposition, and is hard to control the pattern size of a fine pattern of uniform concavo-convex, the shape of a line and the like.

Copper oxide that is a noble metal oxide causes abrupt decomposition to release oxygen when reaching the decomposition temperature, further suppresses particle growth as compared with the noble metal oxides used in Patent Documents 3 and 4, and therefore, is an effective resist material in fine pattern formation. However, as shown in Patent Documents 5 to 8, many etchants for copper exist, but there is no report on achieving selective etching of exposed portions against unexposed portions with high accuracy in performing exposure using an oxide of noble metal, particularly, an oxide of copper.

PRIOR ART DOCUMENT

Patent Document

[Patent Document 1] Japanese Unexamined Patent Publication No. 2007-144995
[Patent Document 2] Japanese Patent Gazette No. 4055543
[Patent Document 3] Japanese Unexamined Patent Publication No. 2008-143162
[Patent Document 4] Japanese Unexamined Patent Publication No. 2008-168610
[Patent Document 5] Japanese Unexamined Patent Publication No. 2005-105410

[Patent Document 6] Japanese Unexamined Patent Publication No. 2005-105333
[Patent Document 7] Japanese Unexamined Patent Publication No. 2001-262374
[Patent Document 8] Japanese Translated Unexamined Patent Publication No. 2008-532289

Non-Patent Publication

[Non-patent Document 1] "Latest Resist Material" published by Johokiko Co., LTD. P. 59-P. 76
[Non-patent Document 2] The 19th Symposium on Phase Change Optical Information Storage 2007 Proceedings P. 77-P. 80

DISCLOSURE OF INVENTION

Problems to be Solved by the Invention

The present invention was made in view of such a respect, and it is an object of the invention to provide an etchant for copper oxide, control of the etching rate, and etching method using the same for enabling exposed portions to be selectively etched against unexposed portions in the case of performing exposure with laser light using an oxide of copper as a heat-reactive resist material, particularly in the case of using CuO (II) as a heat-reactive resist material.

Means for Solving the Problem

As a result of earnest studies and repeated experiments to solve the problem, the inventors of the present invention found out that it is possible to achieve selective etching of exposed portions against unexposed portions and control of the etching rate by using an aqueous solution containing at least an amino acid and a chelating agent with the amino acid being the main component in the case of performing exposure using an oxide of copper as a heat-reactive resist material, and arrived at completion of the invention. In other words, the invention is as described below. In addition, in the present application, amino acid being the main component means that the concentration (weight %) of the chelating agent in the entire etchant is the concentration of the amino acid or less.

An etchant of the invention is an etchant for copper oxide to selectively remove a copper oxide of a particular valence from a copper oxide-containing layer containing copper oxides of different valences, and is characterized by containing at least an amino acid, a chelating agent and water, where concentration (weight %) of the chelating agent in the entire etchant is the concentration of the amino acid or less, and pH thereof is 3.5 or more.

According to this configuration, it is possible to obtain high selectivity with the etchant containing the amino acid and the chelating agent by exploiting a change in the oxidation number of the copper oxide before and after exposure. Therefore, in the case of performing exposure with laser light using an oxide of copper as a heat-reactive resist material, it is possible to obtain the etchant for copper oxide that enables exposed portions to be selectively etched against unexposed portions.

Further, in the above-mentioned etchant, the amino acid preferably contains at least one kind selecting from the group consisting of alanine, arginine, asparagine, aspartic acid, cysteine, glutamine, glutamic acid, glycine, histidine, isoleucine, leucine, lysine, methionine, ornithine, phenylalanine, serine, threonine, tryptophan, tyrosine and valine.

Furthermore, in the above-mentioned etchant, the amino acid preferably contains at least one kind selecting from the group consisting of glycine, alanine, methionine, and lysine.

Still furthermore, in the above-mentioned etchant, the amino acid is preferably glycine.

Moreover, in the above-mentioned etchant, the chelating agent preferably contains at least one kind selecting from the group consisting of acetic acid, oxalic acid, malonic acid, succinic acid, glutaric acid, adipic acid, $\alpha,\omega$-diaminoacetic acid, $\alpha,\omega$-diaminosuccinic acid, $\alpha,\omega$-diaminnopropionic acid, 1,2-diaiminopropane tetraacetic acid, citric acid, isocitric acid, fumaric acid, maleic acid, glutamic acid, malic acid, tartaric acid, bathocuproinedisulfonic acid and salts thereof, and ammonium, bipyridyl, phenanthroline and derivatives thereof.

Further, in the above-mentioned etchant, the chelating agent preferably contains at least one kind selecting from the group consisting of oxalic acid, ammonium acetate, ammonium oxalate, ammonium malonate, ammonium succinate, citric acid, malic acid and tartaric acid.

Furthermore, in the above-mentioned etchant, the chelating agent preferably contains at least one kind selecting from the group consisting of ammonium acetate, ammonium oxalate, ammonium malonate, and ammonium succinate.

Still furthermore, in the above-mentioned etchant, the chelating agent is preferably ammonium oxalate.

Moreover, in the above-mentioned etchant, a percentage of the amino acid in the etchant preferably ranges from 0.01 weight % to 10 weight %.

Further, in the above-mentioned etchant, a percentage of the chelating agent in the etchant is preferably in the range of 0.01 weight % to 10 weight % while being the percentage of the amino acid or less.

Furthermore, in the above-mentioned etchant, the copper oxide-containing layer preferably has a region containing at least an oxide of copper that is thermally decomposed.

An etching method of the invention is an etching method using any one of the etchants as described above, and is characterized by including a thermal decomposition step of thermally decomposing an oxide of copper in a copper oxide-containing layer containing the oxide of copper, and an etching step of supplying the etchant to the copper oxide-containing layer, and removing an oxide of copper that is thermally decomposed from the copper oxide-containing layer.

Further, in the above-mentioned etching method, thermal decomposition of the copper oxide-containing layer is preferably performed by irradiating the copper oxide-containing layer with laser light.

Advantageous Effect of the Invention

According to the invention, it is possible to provide the etchant for copper oxide and etching method for enabling exposed portions to be selectively etched against unexposed portions in the case of performing exposure with laser light using an oxide of copper as a heat-reactive resist material.

BEST MODE FOR CARRYING OUT THE INVENTION

Figure 1:
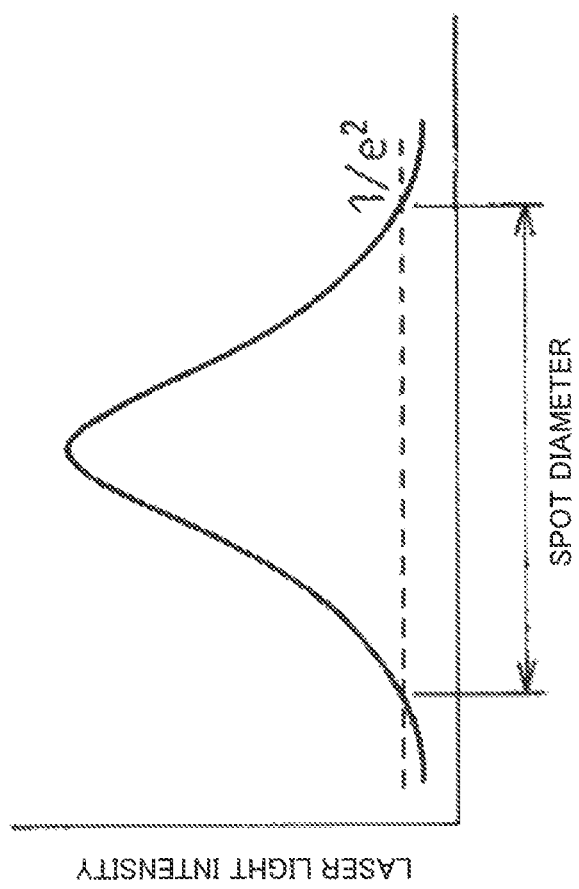
FIG. 1 is a graph showing an intensity distribution of laser light.

An Embodiment of the present invention will specifically be described below.

A target for etching of an etchant of the invention is oxide of copper, and for example, the etchant is used in selectively etching exposed portions against unexposed portions in the case of exposing with laser light using a copper oxide-containing layer with oxide of copper as the main component, as a heat-reactive resist material.

The etchant according to the invention has amino acid as the main component, and is an aqueous solution obtained by mixing at least the amino acid, chelating agent and water. The amino acid being the main component means that the concentration (weight %) of a chelating agent in the entire etchant is the concentration of the amino acid or less. The copper oxide used as the heat-reactive resist material releases oxygen to decompose when reaching the decomposition temperature by heat due to exposure of laser light, and becomes an oxide of copper of a structure different from that before exposure with the composition of a lower degree of oxidation. By causing the aqueous solution obtained by mixing the amino acid, chelating agent and water to act on at least such two types of oxides of copper becoming different structures and compositions by exposure, the amino acid and chelating agent chelation-react with the oxide of copper subjected to exposure, and it is thereby possible to selectively dissolve the oxide of copper in the exposed portion. Herein, although it is possible to measure the valence of the copper oxide (oxide of copper) in the copper oxide-containing layer subsequent to film deposition by X-ray photoelectron spectroscopy (XPS), in the present invention, as long as film deposition is performed using a target of copper(II) oxide, even when the valence of the copper oxide in the copper oxide-containing layer subjected to film deposition is slightly different, the copper oxide is judged as substantially being the valence of II.

Thus, in the invention, it is possible to obtain high selectivity with the etchant containing the amino acid and chelating agent by exploiting a change in the oxidation number of copper oxide before and after exposure. This is caused by a large difference in activation energy between the unexposed portions and the exposed portions because activation energy is high in the chelation reaction between the amino acid that is the main component and the oxide of copper in the unexposed portions, while being low in the exposed portions. Further, etching proceeds also by the amino acid and chelating agent forming complexes with the copper oxide in a composite manner.

In addition, shown herein is the case of changing the structure and composition of oxide of copper by exposure with laser light on the oxide of copper, and the invention is not limited to irradiation of laser light, as long as the method enables the oxide of copper to be decomposed by applying heat of a predetermined temperature or more to a predetermined region of the copper oxide-containing layer. Further, oxide of copper being the main component means that the copper oxide-containing layer is comprised of the oxide of copper in an amount of 50 weight % or more, preferably 70 weight % or more, further preferably 80 weight % or more, and most preferably 90 weight % or more of structural components. When the percentage of the oxide of copper is less than 50 weight %, since the decomposition reaction of the oxide of copper does not proceed uniformly, it is difficult to selectively etch. Meanwhile, when the percentage of the oxide of copper is 90 weight % or more, since the decomposition reaction proceeds uniformly, it is possible to selectively etch.

The amino acid used in the invention is specifically alanine, arginine, asparagine, aspartic acid, cysteine, glutamine, glutamic acid, glycine, histidine, isoleucine, leucine, lysine, methionine, ornithine, phenylalanine, serine, threonine, tryptophan, tyrosine and valine. In the invention, the amino acid contains at least one kind thereof. Among the amino acids, it is preferable to contain at least glycine, alanine, methionine and lysine, and it is more preferable to contain glycine.

The chelating agent used in the invention is specifically acetic acid, oxalic acid, malonic acid, succinic acid, glutaric acid, adipic acid, α,ω-diaminoacetic acid, α,ω-diaminosuccinic acid, α,ω-diaminnopropionic acid, 1,2-diaminopropane tetraacetic acid, citric acid, isocitric acid, fumaric acid, maleic acid, glutamic acid, malic acid, tartaric acid, bathocuproinedisulfonic acid and ammonium salts thereof, ammonium, bipyridyl, and phenanthroline. In the invention, the chelating agent contains at least one kind thereof. Among the agents, it is preferable to contain oxalic acid, ammonium acetate, ammonium oxalate, ammonium malonate, ammonium succinate, citric acid, malic acid, tartaric acid, ammonium, bipyridyl, phenanthroline, and derivatives thereof. In consideration of the fact that the complex formation rate is high between the chelating agent and copper(I) oxide, and that the complex formation rate is low between the chelating agent and copper(II) oxide, it is further preferable to contain at least oxalic acid, ammonium acetate, ammonium oxalate, ammonium malonate, ammonium succinate, citric acid, malic acid and tartaric acid. Further, when ammonium or ammonium ions coexist in the etchant, it is possible to control activity of the amino acid and chelating agent, it is thereby lower the complex formation rate thereof with copper(II) oxide to improve selectivity, it is thus particularly preferable to contain at least ammonium acetate, ammonium oxalate, ammonium malonate, and ammonium succinate, and it is the most preferable to contain at least ammonium oxalate. In addition, as an ammonium salt of the chelating agent, the salt that is already made may be added, or the salt may be formed in the etchant by mixing separately. For example, in the case of using ammonium oxalate, ammonium oxalate itself may be used, or oxalic acid and ammonium are mixed separately to form ammonium oxalate in the agent.

Further, in the etchant of the invention, as the chelating agent, such a state is included that carboxylic acid and ammonium carboxylate coexist, i.e., state in which a small amount of ammonium is added, for example, composition such that oxalic acid and ammonium oxalate coexist. Further, conversely, such a state is included that ammonium carboxylate and excessive ammonium or ammonium coexist (for example, composition such that ammonium oxalate and another ammonium salt coexist). In other words, the equivalent relationship between the chelating agent and ammonium is capable of being determined arbitrarily within the range of not significantly inhibiting the chelation reaction disclosed in the present invention. For example, 2 equivalent weights of ammonium may be added to 1 equivalent weight of oxalic acid to be equivalent weights required for formation of ammonium oxalate, ammonium less than 2 equivalent weights may be added to make oxalic acid excessive, or conversely, ammonium more than 2 equivalent weights may be added to make ammonium excessive.

As well as water, a solvent used in the invention may contain a solvent having compatibility with water, for example, an organic solvent such as alcohol, acetonitrile and glycol-based solvent. The ratio between water and the solvent having compatibility with water is capable of being set arbitrarily within the range in which the above-mentioned amino acid and chelating agent are dissolved.

In the etchant according to the invention, it is possible to add as appropriate other components such as acid and alkali, oxidizing agent and reducing agent, surfactant, etc. within the range of not significantly inhibiting the chelation reaction between the copper oxide and the amino acid or the chelating agent.

Further, in regard to pH, pH takes values substantially in the range of 1 to 11 depending on the types of amino acid and chelating agent to use, is desirably 3.50 or more, preferably 4.00 or more, more preferably 4.50 or more, and particularly preferably 6.00 or more. When pH is less than 3.5, proceeding of etching is remarkable other than the complex formation reaction with the amino acid and chelating agent, and there is the case that desired selectivity is not obtained. It is possible to adjust pH by adding general acid and alkali, among such acid and alkali are hydrochloric acid, sulfuric acid, nitric acid, ammonium, sodium hydroxide, potassium hydroxide, and tetramethyl ammonium hydroxide, and among the acids and alkalis, particularly preferable are hydrochloric acid, sulfuric acid, sodium hydroxide, potassium hydroxide, and tetramethyl ammonium hydroxide.

In the etchant according to the invention, it is possible to control the etching rate effectively by adjusting the concentration of the amino acid in a region in which the etching rate is relatively low, while adjusting the type and concentration of the chelating agent in a region in which the etching rate is relatively high. This derives from the complex formation reaction rates of the amino acid and chelating agent except the amino acid. Amino acids have relatively low complex formation reaction rates, and are suitable for etching at a low rate, but even when the concentration is increased, the complex formation reaction rate capable of being accelerated is limited. Meanwhile, the chelating agents except the amino acids have relatively high complex formation reaction rates, and therefore, by increasing the concentration, it is possible to effectively accelerate the complex formation reaction rate. In other words, in a region in which the etching rate is relatively low, as the concentration of the amino acid is increased, the etching rate is higher, and as the concentration of the amino acid is decreased, the etching rate is lower. However, in the case of making the etching rate higher, by increasing the concentration of the chelating agent, it is possible to effectively increase the etching rate. Meanwhile, when the concentration of the chelating agent is made too high relative to the concentration of the amino acid, there is a tendency that selectivity of the amino acid degrades. In the invention, by exploiting these characteristics in well balance, suitable concentrations were selected in terms of the thickness of a resist, desired uniformity, efficiency and the like.

In other words, in the invention, the chelating agent is added to increase the entire etching rate, while maintaining selectivity of copper oxides of different valences due to the amino acid. From the above-mentioned viewpoints, the concentration of the amino acid preferably ranges from 0.01 weight % to 10 weight % relative to the entire etchant, and the concentration of the chelating agent is preferably in the range from 0.01 weight % to 10 weight % relative to the entire etchant, while being the concentration of the amino acid or less. When the concentration of the chelating agent is higher than the concentration of the amino acid, since contribution due to the reaction between the chelating agent and copper oxide is large, there is the case that it is not possible to obtain desired selectivity.

The method of causing the etchant to act on a resist is not limited particularly, and a resist may be immersed in the etchant, or the etchant may be sprayed onto a resist. By circulating the etchant in immersing a resist in the etchant or moving the resist, increased is an amount of the etchant hitting the resist per unit time, and it is possible to increase the etching rate. Further, by increasing the spray pressure in spraying the etchant onto the resist, it is possible to increase the etching rate. In the case of spraying the etchant onto the resist, it is also possible to use a method of shifting the nozzle, a method of rotating the resist or the like alone, and using the methods together enables etching to proceed uniformly and therefore, is preferable. It is possible to use an arbitrary type of nozzle used in spray, examples thereof are a line slit, full-cone nozzle, hollow-cone nozzle, flat nozzle, uniform flat nozzle, and solid nozzle, and it is possible to select in accordance with the resist and the shape of a substrate. Further, it is possible to use a one liquid nozzle or two liquid nozzle.

It is also possible to change the etching rate by controlling the temperature in causing the etchant to act on the resist. It is possible to set the temperature arbitrarily by avoiding the ranges in which the etchant freezes, boils, or vaporizes at a rate at which the concentration changes extremely or a component in the etchant or resist is decomposed. From the above-mentioned reason, the temperature is preferably in the range of 0° C. to 80° C., further preferably in the range of 10° C. to 60° C., and most preferably in the range of 20° C. to 40° C.

In causing the etchant to act on the resist, when any impurity such as insoluble fine powder exists in the etchant, there is the risk of being a cause of unevenness particularly in etching a fine pattern, and therefore, it is preferable to filter the etchant beforehand. As a material of a filter used in filtration, it is possible to select a material arbitrarily, as long as the material does not react with the etchant, and examples thereof are PFA and PTFE. The roughness of the mesh of the filter is capable of being selected corresponding to the degree of fineness of the pattern, is 0.2 μm or less, and is more preferably 0.1 μm or less. Further, in order to prevent precipitation and reattachment of an eluted component, spray is preferred to immersion, and furthermore, in spraying the etchant onto the resist, it is desirable to consume the etchant without reusing. In reusing the etchant, it is preferable to remove the eluted component.

Substrates of a resist to cause the etchant according to the invention to act do particularly not undergo limitations in the material and shape. However, materials excellent in surface smoothness and workability are preferable, and among such materials are glass, silicon, silicon dioxide, aluminium, titanium, copper, silver and gold. Among the materials, particularly preferable are glass, silicon, silicon dioxide, aluminium, titanium, and copper. Further, the shape is capable of being a two-dimensional shape such as a plate or a three-dimensional shape such as a roll.

Described next is an etching method using the above-mentioned etchant. The etching method according to the invention includes a thermal decomposition step of thermally decomposing an oxide of copper in a copper oxide-containing layer containing the oxide of copper, and an etching step of supplying the above-mentioned etchant to the copper oxide-containing layer, and removing an oxide of copper that is thermally decomposed from the copper oxide-containing layer.

Figure 2:
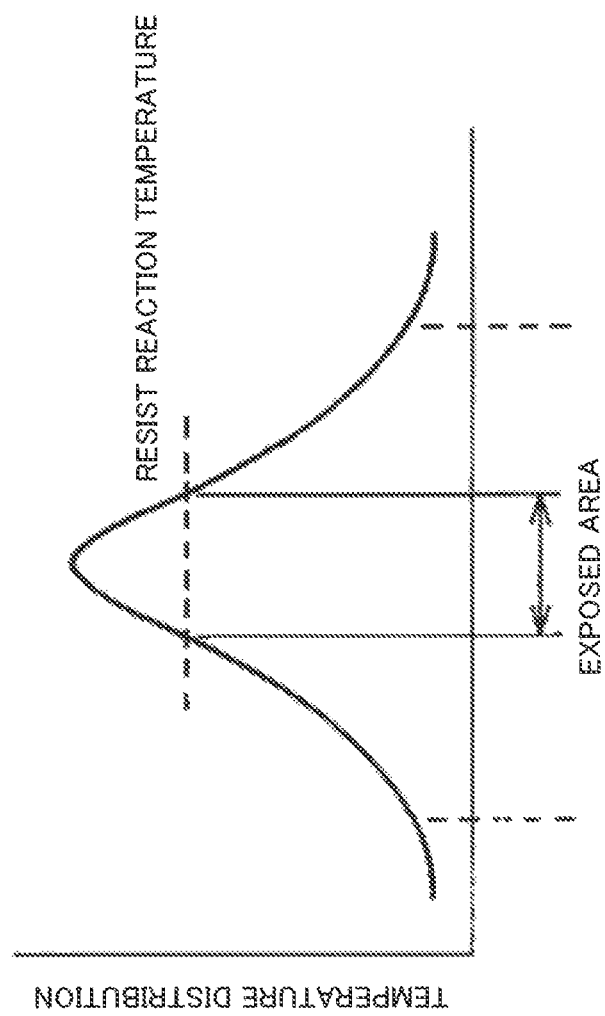
FIG. 2 is a graph showing a temperature distribution of a portion irradiated with laser light.

In the thermal decomposition step, the oxide of copper in a predetermined region of the copper oxide-containing layer is thermally decomposed by applying heat of a predetermined temperature or more to the predetermined region of the copper oxide-containing layer. Further, in the thermal decomposition step, it is preferable to irradiate the copper oxide-containing layer with laser light to thermally decompose the copper oxide-containing layer. By applying laser light to the predetermined region of the copper oxide-containing layer, since temperatures in the predetermined region of the copper oxide-containing layer are made the Gaussian distribution (see FIG. 2), the reaction proceeds only in the portion becoming the predetermined temperature or more, and it is made possible to thermally decompose the range smaller than the spot diameter of the laser light. In addition, in thermal decomposition, the source is not limited to laser light, as long as it is possible to decompose copper oxide with the source by applying heat of a predetermined temperature or more to a predetermined region of the copper oxide-containing layer.

In the etching step, the above-mentioned etchant is supplied to the copper oxide-containing layer to remove an oxide of copper in the predetermined region of the copper oxide-containing layer. In the copper oxide-containing layer subjected to the thermal decomposition step the oxide of copper that is not thermally decomposed and the oxide of copper reduced in the oxidation number by thermal decomposition are coexisted. The amino acid and chelating agent in the etchant selectively chelation-react with the oxide of copper reduced in the oxidation number by thermal decomposition, and it is thereby possible to remove the oxide of copper in the copper oxide region that is thermally decomposed from the copper oxide-containing layer.

The etching method according to the invention preferably includes a step of rinsing an etching layer (copper oxide-containing layer), and a step of rinsing the etched substrate and etching layer.

Described herein are characteristics of the etchant in the invention.

(Difference in the Solution Rate Between Glycine and Ammonium Oxalate)

Figure 3:
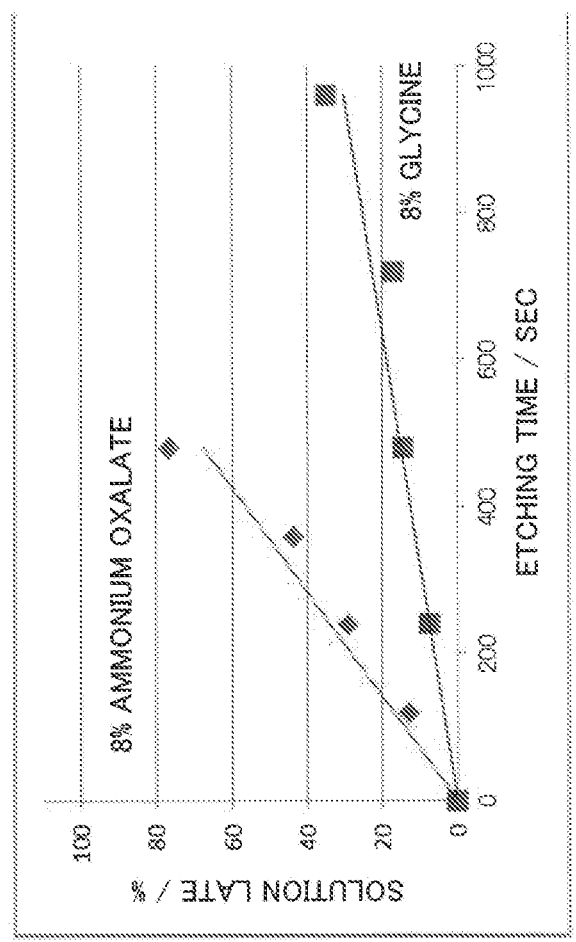
FIG. 3 is a graph illustrating the relationship between etching time and solution rate in the case of dissolving a copper (II) oxide film in each of a glycine aqueous solution and ammonium oxalate aqueous solution.

FIG. 3 is a diagram illustrating the relationship between etching time and solution rate in the case of dissolving a copper(II) oxide film with a film thickness of 20 nm in each of 8 weight % of glycine aqueous solution and 8 weight % of ammonium oxalate aqueous solution. For example, the etching rate is obtained by the following method. Prepared is a plurality of pieces of glass with a copper oxide film with a film thickness of 20 nm formed thereon. Next, the copper content in each film is obtained by X-ray photoelectron spectroscopy before and after causing the etchant to act for a predetermined time, and a solution amount of copper is obtained due to the action of the etchant for the predetermined time. The relationship between the etching time and the solution amount is plotted, and the etching rate is obtained by the gradient of the linear approximation line. From FIG. 3, it is understood that glycine that is amino acid is lower in the solution rate than ammonium oxalate that is the chelating agent. In other words, the amino acid is useful in adjusting the etching rate in a region with a relatively low etching rate, and on the other hand, the chelating agent is useful in adjusting the etching rate in a region with a relatively high etching rate.

(The Oxidation Number of Copper Oxide)

Figure 4:
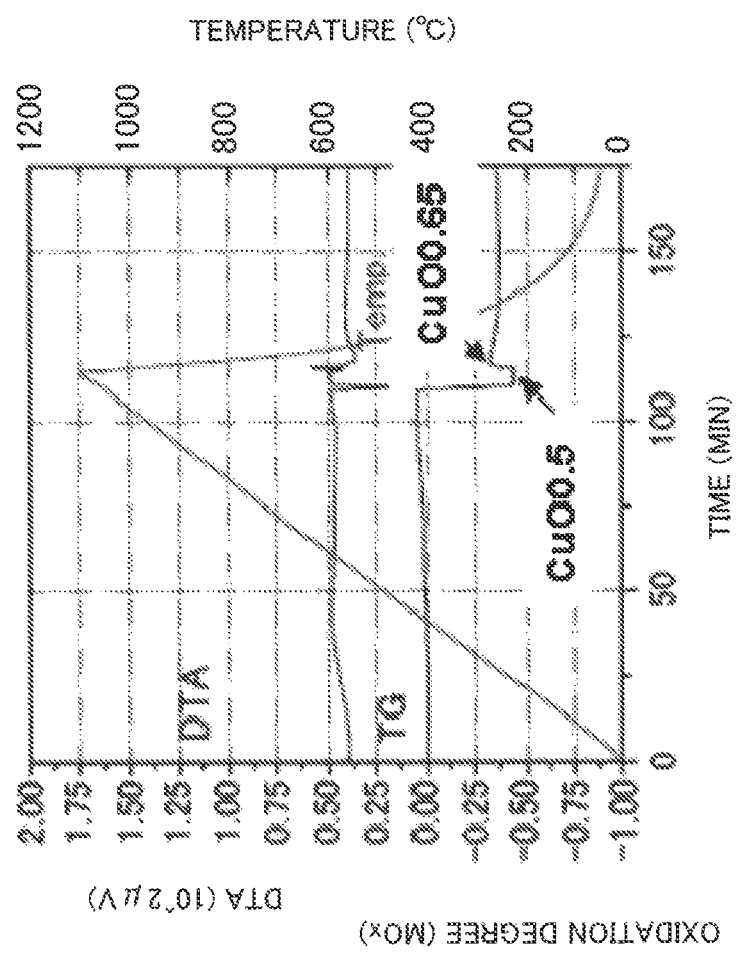
FIG. 4 is a graph showing thermogravimetry measurement results of copper(II) oxide.

FIG. 4 is a diagram showing thermogravimetry measurement results of copper(II) oxide. When thermogravimetry measurement is performed on powder of copper(II) oxide, absorption of heat by reduction of copper(II) oxide is confirmed at 1050° C. (see DTA in FIG. 4), and decreases in the weight derived from release of oxygen associated therewith are observed (see TG in FIG. 4). By estimating the decrease rate of the weight, it is understood that the valence of the copper oxide decreases from 2 (before heating) to almost 1 (after heating). From this result, it is understood that the copper(II) oxide becomes reduced by heating, the oxidation number decreases, and that oxides of copper with copper(I) oxide as the main component are formed. In addition, in FIG. 4, it seems that after decreasing to the valence of 1 (copper(I) oxide, CuO 0.5), re-oxidation occurs to be the valence of 1.5 (CuO 0.65). However, copper(II) oxide was hardly observed from the result of X-ray diffraction described later, and it is presumed that the oxide is substantially in a state of the valence of 1.

Figure 5:
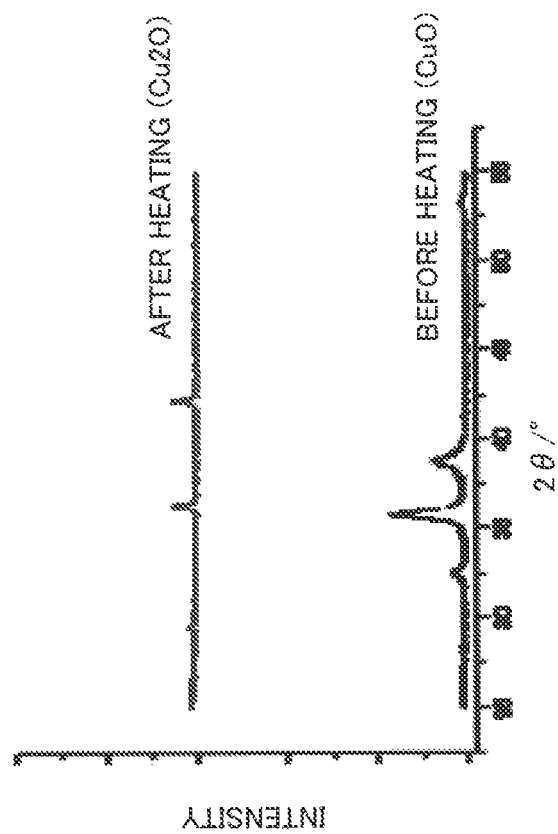
FIG. 5 is a graph showing measurement results of X-ray diffraction of copper(I) oxide and copper(II) oxide.

FIG. 5 is a diagram showing measurement results of X-ray diffraction of copper(I) oxide and copper(II) oxide. When X-ray diffraction is measured before and after heating powder of copper(II) oxide, peaks belonging to copper(II) oxide are observed at room temperature. In contrast thereto, when heating to 1000° C., the peaks belonging to copper(II) oxide disappear, and peaks belonging to copper(I) oxide are only observed (FIG. 5). From this result, it is understood that the valence of copper(II) oxide decreases by heating to change to copper(I) oxide.

(Difference in the Solution Rate Due to a Difference in the Valence of Copper Oxide)

Figure 6:
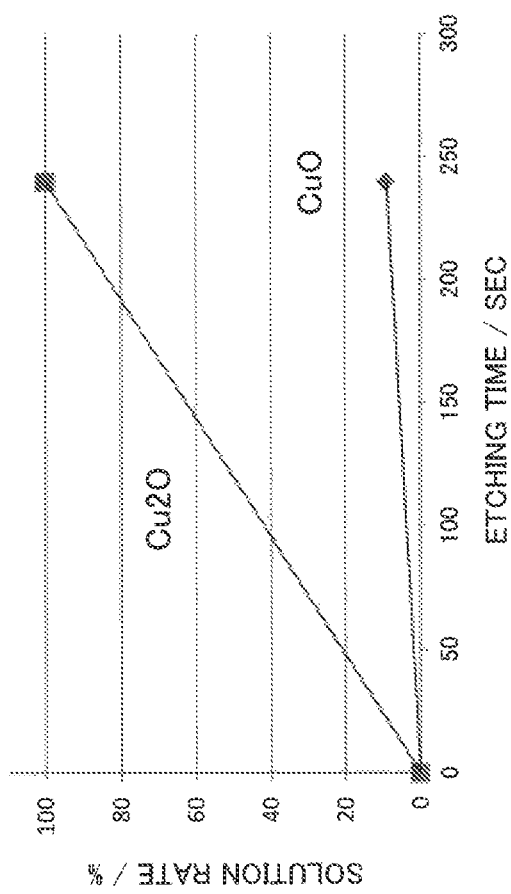
FIG. 6 is a graph illustrating the relationships between etching time and solution rate in the case of dissolving a film of copper(II) oxide using a glycine aqueous solution and in the case of heating the film by exposure to change to copper(I) oxide, and then, dissolving the film using the same solution.

FIG. 6 is a diagram illustrating the relationships between etching time and solution rate in the case of dissolving a film of copper(II) oxide with a film thickness of 10 nm using 3 weight % of glycine aqueous solution and in the case of heating the film by exposure to change to copper(I) oxide, and then, dissolving the film using the same solution. From FIG. 6, in the case of causing 3 weight % of glycine aqueous solution to act, it is understood that copper(I) oxide undergoing heating and changing is dissolved at almost a 10-times rate as compared with copper(II) oxide before changing. In other words, from this data, it is understood that copper(I) oxide selectively dissolves by using the amino acid aqueous solution, in the film in which copper(II) oxide and copper(I) oxide coexist.

Further, Table 1 shows a summary of pH, copper(II) oxide, copper(I) oxide, etching rate of copper and etching rate ratio between copper(II) oxide and copper(I) oxide in each of an aqueous solution containing 0.3 weight % of glycine and 0.15 weight % of ammonium oxalate, an aqueous solution containing 0.3 weight % of glycine and 1.5 weight % of ammonium oxalate, an aqueous solution containing only 0.3 weight % of glycine, and an aqueous solution containing only 0.3 weight % of ammonium oxalate. In the aqueous solution with only glycine, although copper(II) oxide is hardly etched, since the etching rate of copper(I) oxide is also low, good selectivity is obtained but it takes time to etch. Meanwhile, in the aqueous solution with only ammonium oxalate, although the etching rate of copper(I) oxide is improved, since copper (II) oxide is also etched at the same time, it is possible to shorten the time required for etching, but its selectivity isn't even equal to that of glycine. As disclosed in the present invention, when glycine is more in the aqueous solution with glycine and ammonium oxalate, copper(II) oxide is hardly etched, while the etching rate of copper(I) oxide is high, and it is possible to obtain characteristics having both advantages of selectivity due to glycine and the etching rate due to ammonium oxalate. In contrast thereto, when ammonium oxalate is more in the aqueous solution with glycine and ammonium oxalate, characteristics thereof are close to those of the solution with only ammonium oxalate, the etching rate is high, but its selectivity isn't even equal to that of the invention.

TABLE 1

|  |  | 0.3% GLYCINE + 0.15% AMMONIUM OXALATE | 0.3% GLYCINE + 1.5% AMMONIUM OXALATE | 0.3% GLYCINE | 0.3% AMMONIUM OXALATE |
|---|---|---|---|---|---|
| SOLUTION pH |  | 6.23 | 6.36 | 6.09 | 6.51 |
| ETCHING RATE (nm/min) | CuO(II) | LESS THAN 0.01 | 3.00 | LESS THAN 0.01 | 3.00 |
|  | Cu2O(I) | 15.0 | 20.0 | 2.50 | 20.0 |
|  | Cu | 0.00 | 0.00 | 0.00 | 0.00 |
| ETCHING RATE RATIO | CuO(II)/Cu2O(I) | 0.00 | 0.15 | 0.00 | 0.15 |

Examples performed to clarify the effects of the invention will be described below, but any limitation is not imposed on the invention by the Examples.

EXAMPLE 1

Copper oxide films were deposited on glass plate substrates of 50 mmΦ using the sputtering method under the following conditions. In addition, when the valence of the copper oxide film after film deposition was calculated from XPS measurement, the valence exceeded 1.90, and it can be said that the valence of copper oxide was substantially II.
Target: Copper(II) oxide
Power (W): RF100
Type of gas: Mixed gas of argon and oxygen (Ratio 95:5)
Pressure (Pa): 0.1
Film thickness (nm): 20
The copper oxide film was exposed under the following conditions.
Wavelength of semiconductor laser for exposure: 405 nm
Lens numerical aperture: 0.85
Exposure laser power: 1~10 mV
Feed pitch: 500 nm It is possible to fabricate various shapes and patterns by modulating the intensity of the laser during exposure, but in the experiments, to make evaluations of the interface after etching easy, consecutive groove shapes were used as a pattern. The shape to form can be an isolated circular shape, elliptical shape, etc. according to the intended use, and the invention does not undergo any limitation by the exposure shape.

As an indicator to represent that only the exposed or unexposed portion of the copper oxide film is dissolved selectively, when the ratio of the groove depth after etching to the original film thickness was in the range of 0.9 to 1, i.e. in the case of the Examples, when the groove depth was in the range of 18 nm to 20 nm with respect to the film thickness of 20 nm, it can be said to represent that etching proceeded selectively.

Next, the copper oxide sample exposed under the above-mentioned conditions was etched with an etchant prepared under the conditions as described below.

| Glycine | 1.2 g |
|---|---|
| Ammonium oxalate | 1.2 g |
| Water | 400 g |
| pH | 6.34 |

Etching was performed by immersing the above-mentioned copper oxide in the etchant at 23° C. for 2 minutes. Next, an AFM (Atomic Force Microscope) image of the etched copper oxide film was measured. As a result, a periodical groove shape with a groove depth of 19.5 nm was observed. With respect to a pitch of 500 nm, the groove width was 147 nm. From the above-mentioned description, obtained was the result showing that only copper oxide changed in the structure and composition by the thermal reaction due to exposure was selectively etched, and that copper oxide that was not exposed was not etched.

EXAMPLE 2

Copper oxide undergoing film deposition and exposure on the same conditions as in Example 1 was etched with an etchant prepared under the conditions as described below.

| Glycine | 1.2 g |
|---|---|
| Ammonium oxalate | 0.6 g |
| Water | 400 g |
| pH | 6.15 |

Etching was performed by immersing the above-mentioned copper oxide in the etchant at 23° C. for 2 minutes. Next, an AFM image of the etched copper oxide film was measured. As a result, a periodical groove shape with a groove depth of 13.8 nm was observed. Further, the copper oxide was immersed at 23° C. for 1 minute using the same etchant. An AFM image of the etched copper oxide film was measured, and a periodical groove shape with a groove depth of 18.6 nm was observed. With respect to a pitch of 500 nm, the groove width was 137 nm. From the above-mentioned description, obtained was the result showing that only copper oxide changed in the structure and composition by the thermal reaction due to exposure was selectively etched, and that copper oxide that was not exposed was not etched.

EXAMPLE 3

Copper oxide undergoing film deposition and exposure on the same conditions as in Example 1 was etched with an etchant prepared under the conditions as described below.

| Glycine | 1.2 g |
|---|---|
| Ammonium oxalate | 0.4 g |
| Water | 400 g |
| pH | 6.04 |

Etching was performed by immersing the above-mentioned copper oxide in the etchant at 23° C. for 2 minutes. Next, an AFM image of the etched copper oxide film was measured. As a result, a periodical groove shape with a groove depth of 11.4 nm was observed. Further, the copper oxide was immersed at 23° C. for 2 minutes using the same etchant. An AFM image of the etched copper oxide film was measured, and a periodical groove shape with a groove depth of 19.8 nm was observed. With respect to a pitch of 500 nm, the groove width was 148 nm. From the above-mentioned description, obtained was the result showing that only copper oxide changed in the structure and composition by the thermal reaction due to exposure was selectively etched, and that copper oxide that was not exposed was not etched.

COMPARATIVE EXAMPLE 1

Copper oxide undergoing film deposition and exposure on the same conditions as in Example 1 was etched with an etchant prepared under the conditions as described below.

| | |
|---|---|
| Glycine | 1.2 g |
| Ammonium oxalate | 6 g |
| Water | 400 g |
| pH | 6.36 |

Etching was performed by immersing the above-mentioned copper oxide in the etchant at 23° C. for 2 minutes. Next, an AFM image of the etched copper oxide films was measured. As a result, a periodical groove shape with a groove depth of 14.2 nm was observed. With respect to a pitch of 500 nm, the groove width was 160 nm. Further, the copper oxide was immersed at 23° C. for 2 minutes using the same etchant. An AFM image of the etched copper oxide film was measured, and a periodical groove shape with a groove depth of 12.8 nm was observed. With respect to a pitch of 500 nm, the groove width was 172 nm. The reason why the ratio of the groove depth decreased by additional etching is dissolution of the unexposed portion was remarkable. From the above-mentioned description, obtained was the result showing that copper oxide changed in the structure and composition by the thermal reaction due to exposure was etched, a part of unexposed copper oxide was also etched, and that selectivity of etching was not sufficient.

COMPARATIVE EXAMPLE 2

Copper oxide undergoing film deposition and exposure on the same conditions as in Example 1 was etched with an etchant with the composition as described below disclosed in Patent Document 8.

| | |
|---|---|
| Glycine | 4.5 g |
| Fluorinated ammonium | 0.2 g |
| 1-hydroxy ethylidene-1,1-diphosphonic acid | 0.3 g |
| Phosphonic acid | 0.02 g |
| Propylene glycol monomethyl ether | 50 g |
| Water | 400 g |
| pH | 2.58 |

Etching was performed by immersing the above-mentioned copper oxide in the etchant at 23° C. for 2 minutes. As a result, the whole of the copper oxide film disappeared, and a periodical groove shape was not obtained. It is disclosed in Patent Document 8 that the composition of the etchant used in Comparative Example 2 is the effective composition in the case of dissolving selectively copper oxide from a mixture of copper and copper oxide. From the above-mentioned description, it is conceivable that the etchant (etchant in Comparative Example 2) to dissolve selectively copper oxide from a mixture of copper and copper oxide is not suitable for the purpose of selectively removing copper oxide of a particular valence from a copper oxide-containing layer containing copper oxides of different valences disclosed in the present patent application.

COMPARATIVE EXAMPLE 3

Copper oxide undergoing film deposition and exposure on the same conditions as in Example 1 was etched with an etchant with the composition as described below disclosed in Patent Document 8.

| | |
|---|---|
| Oxalic acid | 4.5 g |
| Fluorinated ammonium | 0.2 g |
| 1-hydroxy ethylidene-1,1-diphosphonic acid | 0.3 g |
| Phosphonic acid | 0.02 g |
| Propylene glycol monomethyl ether | 87.5 g |
| Water | 400 g |
| pH | 2.73 |

Etching was performed by immersing the above-mentioned copper oxide in the etchant at 23° C. for 2 minutes. As a result, the whole of the copper oxide film disappeared, and a periodical groove shape was not obtained. It is disclosed in Patent Document 8 that the composition of the etchant used in Comparative Example 3 is the effective composition in the case of dissolving selectively copper oxide from a mixture of copper and copper oxide. From the above-mentioned description, it is conceivable that the etchant (etchant in Comparative Example 3) to dissolve selectively copper oxide from a mixture of copper and copper oxide is not suitable for the purpose of selectively removing copper oxide of a particular valence from a copper oxide-containing layer containing copper oxides of different valences disclosed in the present patent application.

Table 2 shows the results of Examples 1 to 3 and Comparative Examples 1 to 3.

TABLE 2

| | GLYCINE [g] | AMMONIUM OXALATE [g] | pH | RATIO OF GROOVE DEPTH | REMARKS |
|---|---|---|---|---|---|
| EXAMPLE 1 | 1.2 | 1.2 | 6.34 | 0.98 | |
| EXAMPLE 2 | 1.2 | 0.6 | 6.15 | 0.93 | |
| EXAMPLE 3 | 1.2 | 0.4 | 6.04 | 0.99 | |
| COMPARATIVE EXAMPLE 1 | 1.2 | 6.0 | 6.36 | 0.71 | |
| COMPARATIVE EXAMPLE 2 | 4.5 | 0.0 | 2.58 | — | WITH OTHER ADDITIVES |
| COMPARATIVE EXAMPLE 3 | 0 | 4.5 (OXALIC ACID) | 2.73 | — | WITH OTHER ADDITIVES |

From the above-mentioned description, in Examples 1 to 3, it is understood that etching proceeded selectively in the exposed portion of the copper oxide film because the ratio of the groove depth after etching to the original film thickness was in the range of 0.9 to 1. Meanwhile, in Comparative Example 1, it is understood that selectivity of etching was insufficient in the exposed portion of the copper oxide film because the ratio of the groove depth after etching to the original film thickness was not in the range of 0.9 to 1. Further, in Comparative Examples 2 and 3, since the periodical groove shape was not obtained originally, it is understood that it was extremely difficult to selectively dissolve the exposed portion of the copper oxide film with the etchant for copper.

Industrial Applicability

The etchants according to the invention enable exposed portions to be selectively etched against unexposed portions in the case of performing exposure with laser light using copper oxide as a heat-reactive resist, are thereby useful in preparation of a fine pattern, and are capable of being applied in various fields of optical materials and the like.

In addition, the present invention is not limited to the above-mentioned Embodiment, and is capable of being carried into practice with various modifications thereof. In the above-mentioned Embodiment, the size, shape and the like shown in the accompanying drawings are not limited thereto, and are capable of being carried into practice with modifications thereof as appropriate within the scope of exhibiting the effects of the invention. Moreover, the invention is capable of being carried into practice with modifications thereof as appropriate without departing from the scope of the invention.

The present application is based on Japanese Patent Application No. 2011-145789 filed on Jun. 30, 2011, entire content of which is expressly incorporated by reference herein.

The invention claimed is:

1. An etching method using an etchant including:
   a thermal decomposition step of thermally decomposing an oxide of copper in a copper oxide-containing layer containing the oxide of copper; and
   an etching step of supplying the etchant to the copper oxide-containing layer, and removing an oxide of copper that is thermally decomposed from the copper oxide-containing layer, wherein said etchant contains:
   at least an amino acid, a chelating agent and water,
   wherein concentration (weight %) of the chelating agent in the entire etchant is the concentration of the amino acid or less, and pH thereof is 6.04 to 6.34,
   wherein the chelating agent is ammonium oxalate, and
   wherein the amino acid is glycine.

2. The etching method according to claim 1, wherein thermal decomposition of the copper oxide-containing layer is performed by irradiating the copper oxide-containing layer with laser light.

* * * * *